US006275365B1

(12) United States Patent
Kalsi et al.

(10) Patent No.: US 6,275,365 B1
(45) Date of Patent: Aug. 14, 2001

(54) RESISTIVE FAULT CURRENT LIMITER

(75) Inventors: Swarn S. Kalsi; Gregory L. Snitchler, both of Shrewsbury, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/020,431

(22) Filed: Feb. 9, 1998

(51) Int. Cl.[7] .................................................. H02H 7/00
(52) U.S. Cl. ......................... 361/19; 361/58; 174/125.1
(58) Field of Search ................................ 361/10, 11, 19, 361/57, 58, 141; 336/DIG. 1; 335/216, 299, 300; 505/211, 212, 238, 239, 850, 879, 885; 174/125.1

(56) References Cited

U.S. PATENT DOCUMENTS

| | | | |
|---|---|---|---|
| 3,569,883 | * | 3/1971 | Van Nice ................................ 336/70 |
| 3,737,831 | * | 6/1973 | Rietz et al. ............................ 338/261 |
| 4,994,932 | | 2/1991 | Okamoto et al. ........................ 361/19 |
| 5,140,266 | * | 8/1992 | Dorri et al. ............................ 324/228 |
| 5,432,666 | | 7/1995 | Hodge ..................................... 361/19 |
| 5,450,266 | | 9/1995 | Downie .................................... 361/19 |
| 5,475,560 | | 12/1995 | Onishi et al. ......................... 361/141 |
| 5,531,015 | * | 7/1996 | Manlief et al. .......................... 29/599 |
| 5,546,261 | | 8/1996 | Yoshida et al. ........................ 361/19 |
| 5,551,532 | | 9/1996 | Kupersmith ........................... 187/391 |
| 5,600,522 | | 2/1997 | Hull ........................................ 361/19 |
| 5,617,280 | | 4/1997 | Hara et al. .............................. 361/19 |
| 5,659,277 | * | 8/1997 | Joshi et al. ........................... 335/216 |
| 5,694,279 | | 12/1997 | Mumford ................................ 361/19 |

FOREIGN PATENT DOCUMENTS

| | | | |
|---|---|---|---|
| 503 447 A2 | 9/1992 | (EP) | .............................. H01L/39/24 |
| 2677503 | 12/1992 | (FR) | ............................... H02H/9/02 |

OTHER PUBLICATIONS

Underground Power Transmission by Superconducting Cable, chapter 5.3, pp. 37–38, Ed. E.B. Forsyth, Mar., 1972.
"The Development and Utilization of Superconducting Fault Current Limiters", VDI Technology–Center Physical Technologies, Dusseldorf, Germany, pp. 44–47 and 57–61, 1995, No Month.

* cited by examiner

Primary Examiner—Ronald W. Leja
(74) Attorney, Agent, or Firm—Fish & Richardson P.C.

(57) ABSTRACT

An electric coil includes bifilar pancake coils electrically connected to an adjacent pancake coil so that current flowing in adjacent turns of adjacent pancake coils flows in opposite directions at all radial region of the coil assembly. The superconducting fault current limiter is configured to provide a minimized inductance and low resistance in a normal state of operation. On the other hand, when a fault current exceeds a predetermined threshold, the resistance increases to a level sufficient for limiting the flow of fault current to a desired level until a circuit breaker connected within the electrical system opens the circuit.

31 Claims, 5 Drawing Sheets

RESISTIVE FAULT CURRENT LIMITER

BACKGROUND OF THE INVENTION

This invention relates to fault current limiters.

Fault currents are large (usually temporary) increases in the normal current flowing in a power transmission system. A fault current can occur from any number of different events including lightning strikes or catastrophic failure of electrical equipment which can cause short circuits. A short circuit, for example, can cause a twenty-fold or more increase in current flow to the circuit.

Conventional circuit breakers are used in virtually every power transmission and distribution system to "open" the circuit and interrupt current flow in the event of a fault. The fault current level grows as new equipment is added over time. However, with an increase in the magnitude of fault current comes an increase in the size and expense of the circuit breaker. Moreover, conventional circuit breakers do not open instantaneously. The fault current is generally first detected by a current sensor which generates a signal to a control circuit. The control circuit processes the signal and then generates a control signal to open the circuit breaker. During these steps (which may have a duration as long as 100 msec), the circuit breaker, as well as other parts of the transmission system are subjected to the higher fault current level. Thus, the circuit breaker, transformers, as well as other components of the system are often rated to withstand, for a period of time,the higher current levels.

Fault current limiters were developed to insert impedance in a connection quickly so as limit the magnitude of the fault current to a reduced level, thereby protecting the circuit breaker and the power transmission system. Many fault current limiters include tuned reactance circuits which store energy in proportion to the circuit inductance.

The transition characteristics of superconducting materials have been used advantageously to develop superconducting fault current limiters. For example, in one conventional approach, a superconducting current limiting device is constructed using a heat dissipating wafer (e.g., sapphire) having a thin coating of superconducting material deposited onto a surface of the wafer. When a fault is detected, the coating transitions into its normal state and becomes resistive, thereby limiting the flow of current until a circuit breaker, in parallel with the device, interrupts the current flow.

In another conventional approach, a resistive superconducting solenoid is connected within a bridge circuit of diodes or thyristors. In normal operation, current flows through forward-biased pairs of the diodes, bypassing the superconducting solenoid. On the other hand, when the level of current increases above a threshold fault level, the diodes or thyristors become reversed-biased causing the current to flow through the resistive superconducting solenoid which becomes resistive due to the high level of current. In still other approaches, bulk superconducting rods or rings are used to limit the level of fault currents.

SUMMARY OF THE INVENTION

The invention features a superconducting fault current limiter configured as a coil assembly to provide a minimized inductance and low resistance in a normal state of operation. When a fault current exceeds a predetermined threshold, the resistance increases to a level sufficient for limiting the flow of fault current. These electrical characteristics are achieved within a relatively small, compact coil arrangement and provide protection to electrical utility systems or other transmission systems on-demand and in a reliable manner.

In a general aspect of the invention, the coil assembly includes adjacent bifilar pancake coils electrically connected so that current in adjacent turns of the adjacent pancake coils flows in opposite directions. The bifilar pancake coils are disposed in a stack arrangement along the longitudinal axis. Each coil includes a pair of conductive winding sections joined along an innermost radial region of the coil, wound together, one over the other, radially outward and around the longitudinal axis.

Magnetic coils are generally constructed to provide a large inductive component in a relatively compact space. This coil arrangement, on the other hand, provides a coil which minimizes the total inductance while providing a required resistance when current flowing through the coil exceeds a threshold value, all within a compact space. The coil arrangement includes a pair of parallel wound, bifilar windings so that current in one segment of the winding flows in a direction opposite to that of an adjacent segment of the winding. Because the currents flow in opposite directions, magnetic flux and inductance induced by these currents are minimized. Thus, a relatively compact superconducting fault current limiter with minimum inductance and high resistance in its non-superconducting state is provided.

In another aspect of the invention, two or more of the coil assemblies are positioned on a support structure to provide a fault current limiter assembly.

In another aspect of the invention, a method of providing a coil includes electrically connecting adjacent pancake coils so that current flowing in adjacent turns of adjacent pancake coils flows in opposite directions.

Embodiments of the above aspects of the invention may include one or more of the following features.

Electrically connecting adjacent bifilar pancake coils in a series is one approach for providing an arrangement in which current flows in adjacent turns of adjacent pancake coils in opposite directions. The winding sections are each formed from an integral piece of conductive material provided in bifilar fashion. A second pair of conductive windings joined along an innermost radial region of the coil (i.e., a second bifilar winding) is wound over and connected in parallel to the first-mentioned conductive winding in order to increase the current-carrying capacity of the conductive winding sections.

The conductive winding is formed of a superconducting material (e.g., high or low temperature superconductor). In embodiments using an HTS superconductor, the material is anisotropic and is in the form of a superconducting tape. In certain applications, the anisotropic superconducting material is a multi-filament composite conductor including multiple superconducting filaments enclosed in matrix-forming material. In other embodiments, the superconducting material is not anisotropic and is a monolithic superconductor material.

The fault current limiters have numerous applications including bus-tie and co-generation applications. The superconducting fault current limiter also provides a level of isolation between neighboring power utility transmission and distribution networks, permitting them to be connected together while minimizing the risk that a fault occurring on one will affect the other.

Other advantages and features will become apparent from the following description and the claims.

DETAILED DESCRIPTION

Figure 1:
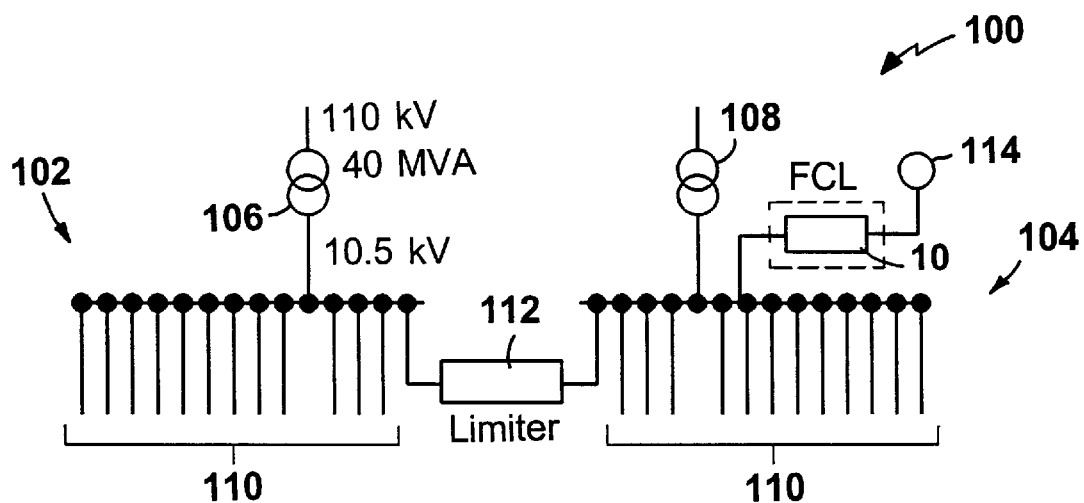
FIG. 1 is a schematic representation of an electrical utility substation system with a fault current limiter in a bus-tie position.

Referring to FIG. 1, a bus network 100 of a portion of an electrical power system includes a pair of sub-networks 102, 104 each having an associated transformer 106, 108 for stepping-down a high voltage (e.g., 110 KV) from the power grid to a lower distribution voltage (e.g., 10.5 KV). Each of sub-networks 102, 104 provide electrical power to a smaller geographical region (e.g., industrial complex, residential area) via power transmission lines 110. A limiter 112 ties sub-networks 102, 104 together so that either sub-network can provide or supplement power to the other in the event of a failure (e.g., failed transformer). Sub-network 104 also includes a superconducting fault current limiter 10 connected between the output of transformer 108 and a connection point 114 which, for example, leads to another portion of bus network 100 or to another power generation source. Superconducting fault current limiter 10 is housed in a cryostat (thermal container) and is cryogenically cooled.

The main purpose of a fault current limiter in a network is to limit the short-circuit current to a level that can be safely interrupted by a circuit breaker. Fault current limiter 10 limits the amount of current flowing therethrough to a predetermined threshold level typically 3 to 5 times of the normal level in the event of catastrophic electrical failure such as a short circuit. Fault current limiter 10 limits the current for a period sufficient (about 0.5 seconds) to allow a circuit breaker (not shown) to interrupt current flow and prevent damage to the components connected to and within bus network 100. In the application shown in FIG. 1, in essence, fault current limiter 10 serves to isolate bus network 100 from connection point 114. Thus, for example, if connection point 114 is connected to a power generating source which contributes to the fault current during an electrical fault, bus network 100 is protected. Because fault current limiter 10 is a bi-directional device, the power generating source tied to connection point 114 is also protected from fault current contributed by bus network 100.

Figure 2:
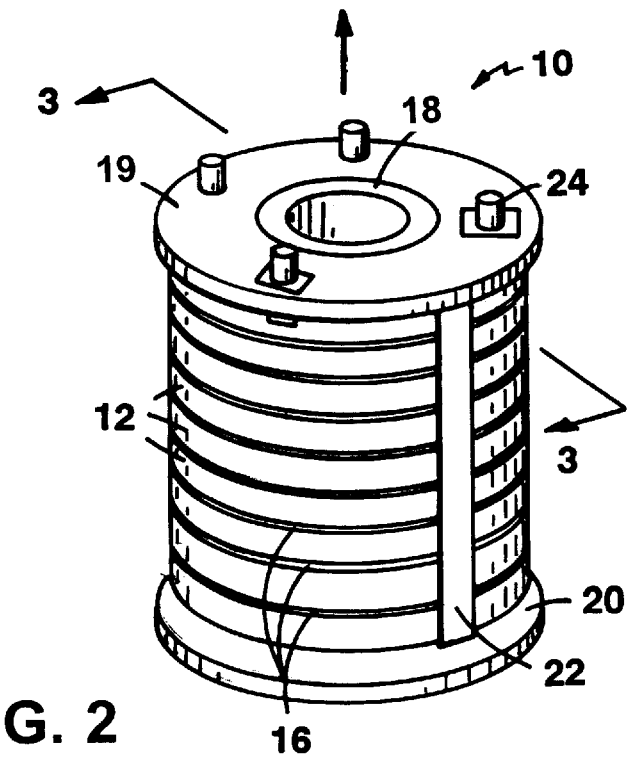
FIG. 2 is a perspective view of a superconducting fault current limiting coil.
Figure 3:
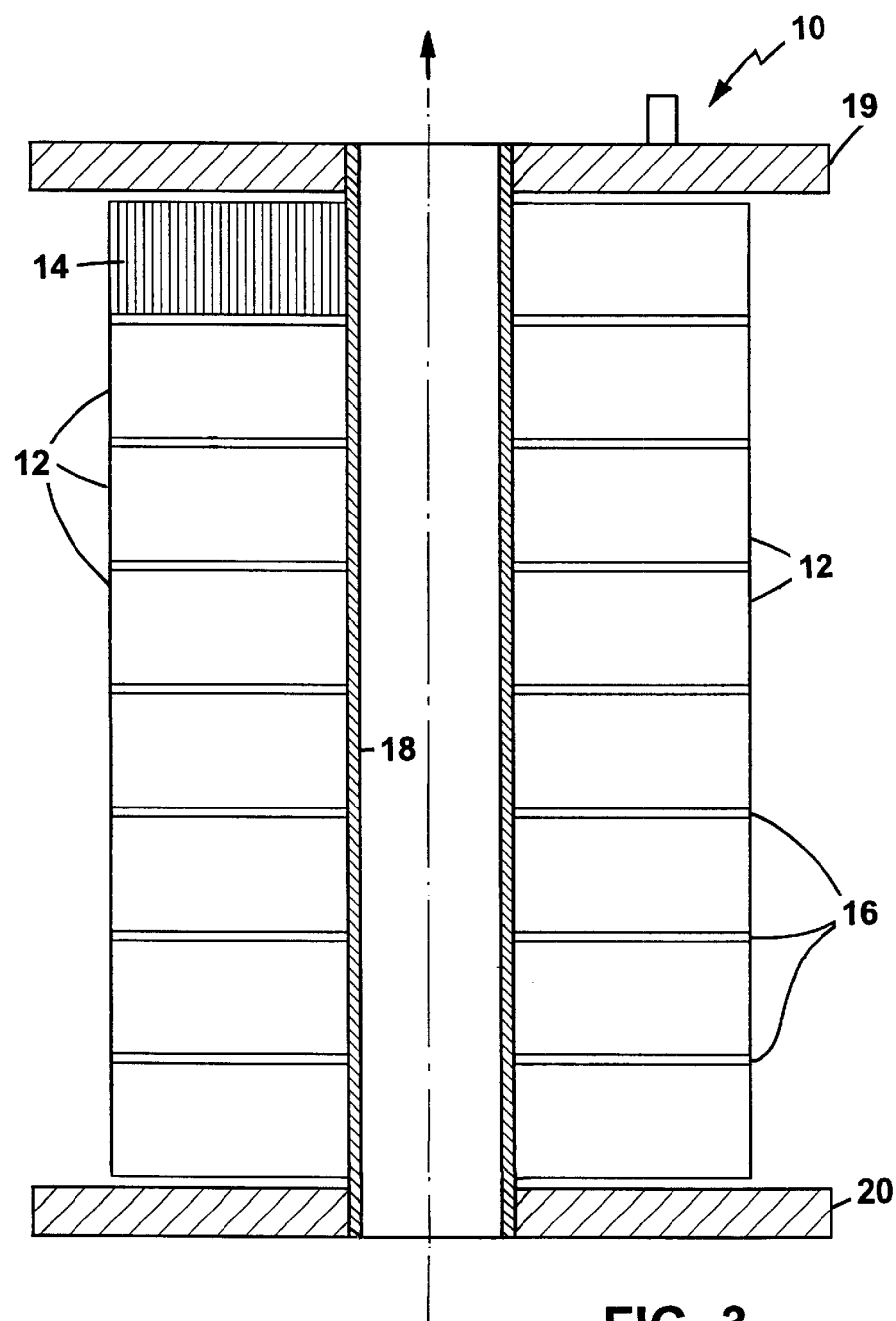
FIG. 3 is a cross-sectional view of the coil along lines 3—3 shown in FIG. 2.

Referring to FIGS. 2 and 3, fault current limiter 10 includes a series of bifilar "pancake" coils 12, each having co-wound, bifilar conductors. Each "pancake" coil 12 is separated by an insulation layer 16 and is wound from the same continuous length of superconducting tape 14 using the approach described below in conjunction with FIG. 4. Insulation layer 16 may, for example, be formed of a suitable material to provide a cooling gap or other structure for facilitating the flow of liquid cryogen into and around individual pancake coils 12.

Superconductor tape 14 may be formed from a high temperature copper oxide ceramic superconducting material, such as $Bi_2Sr_2Ca_2Cu_3O$, commonly designated BSCCO (2223) which is typically in the form of a composite of individual superconducting filaments surrounded by a matrix forming material (e.g., silver or other noble metal). A description of such composite superconducting tapes is described in U.S. Pat. No. 5,531,015, which is hereby incorporated by reference.

Alternatively, superconducting tape may be formed in monolithic form, meaning that the HTS anisotropic superconductor is in the form of a monofilament or a group of closely spaced multifilaments which are electrically fully coupled to each other and act as a monofilament. The monolithic form conductor 18 may be a rare-earth-copper-oxide family (YBCO) material such as those described in U.S. Pat. No. 5,231,074 to Cima et al., entitled "Preparation of Highly Textured Oxide Superconducting Films from MOD Precursor Solutions" which is hereby incorporated by reference.

Details relating to the types of superconductors and their methods of fabrication suitable for use in forming tape 14 are described in co-pending application Ser. No. 08/444,564 filed on May 19, 1995 by G. L. Snitchler, G. N. Riley, Jr., A. P. Malozemoff and C. J. Christopherson, entitled "Novel Structure and Method of Manufacture for Minimizing Filament Coupling Losses in Superconducting Oxide Composite Articles", assigned to the assignee of the present invention, and incorporated by reference. Ser. No. 08/719,987, filed Sep. 25, 1996, entitled "Decoupling of Superconducting Filaments in High Temperature Superconducting Composites," assigned to the assignee of the present invention, and incorporated by reference also describes methods of manufacturing superconducting wires.

Pancake coils 12 are shown in FIGS. 2 and 3 as being circularly shaped; however, in other applications each pancake may have other shapes commonly used for making magnetic coils, including racetrack and saddle-shaped coils.

An inner support tube 18 supports coils 12 with a first end member 19 attached to the top of inner support tube 18 and a second end member 20 threaded onto the opposite end of the inner support tube in order to compress the "pancake" coils. Inner support tube 18 and end members 19, 20 are fabricated from a suitable material, such as aluminum or plastic (for example, G-10). In some applications, inner support tube 18 and end members 19, 20 can be removed to form a free-standing coil assembly.

A length of superconducting material 22 also connects one end of coil assembly 10 to one of the termination posts 24 located on end member 18 in order to supply current to coil assembly 10. The bridging segments may be fabricated from metal, composite superconductor, or a pure superconductor and is electrically insulated from the coil.

Figure 4:
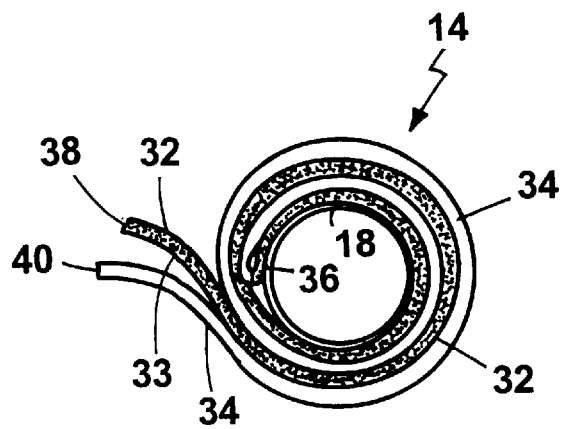
FIG. 4 is a top view of a single winding of the coil of FIG. 2.

Referring to FIG. 4, each pancake coil 12 is formed from the same continuous length of superconducting tape 14 as a pair of conductive segments 32, 34 folded over itself at an intermediate loop region 36 (or two separate conductors joined together at this location) and then wound around support tube 18. In the top view shown in FIG. 4, the edge of conductive segment 32 is darkened to distinguish it from conductive segment 34. With this bifilar, parallel winding technique used to form the coil, ends 38, 40 of superconducting tape 30 extend from the outer radial region of the coil. Current applied to one of ends 38, exits the other end 40 so that current flowing in conductive segments 32, 34 flows in opposite directions. For example, if current is introduced at end 38 of conductive segment 32, the direction of current in this segment flows in the counterclockwise direction until it reaches conductive segment 34 at loop region 36 where the current effectively reverses relative to its direction of flow around the horizontal axis and flows in the clockwise direction. Superconducting tape 14 includes a thin layer of insulation 33 (e.g., glass epoxy or polyimide film) to electrically isolate conductive segments 32, 34. In order to reduce bend strain in superconductor 14, the size of the loop in region 36 can also be increased.

Figure 5:
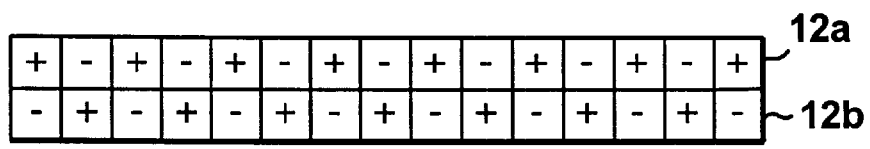
FIG. 5 is a cross-sectional view of a pair of adjacent windings.

Referring to FIG. 5, adjacent pancake coils 12a, 12b are electrically connected along the outer radial portion of fault current limiter 10 in series so that the current in corresponding turns of adjacent pancake coils 12a, 12b flows in opposite directions. A necessary number of double pancakes shown in FIG. 5 are assembled to form a fault current limiter coil 10. The connections are made using short bridging segments of electrically conductive material (e.g., copper or superconducting). With this arrangement, flux lines generated by the flow of current in each turn are essentially concentrated to the vicinity of each conductor. In this configuration, each conductor experiences only the self-generated field and the field due to current in immediately adjacent conductors. The field due to other conductors (or turns) is cancelled. This cancellation effect occurs not only in the radial direction from adjacent windings within a pancake coil, but also in the longitudinal direction from adjacent turns of adjacent pancake coils.

To illustrate this concept a cross-sectional view of a pair of adjacent coils 12a, 12b is shown with the direction of current flow indicated by "+" and "−" signs. In particular, "+" and "−" signs represent current flow into and out of the page, respectively. With this arrangement, the flux generated by the flow of current in adjacent windings have the opposite sense and, cancel (away from conductor pairs), thereby reducing the overall inductance of the coil. In essence, this parallel, bifilar winding approach provides a low inductance with a configuration (i.e., coil, solenoid) commonly associated with providing high inductance.

A fault current limiter coil 10 has one end connected to high voltage and the other end connected to ground. If special arrangements are not made, the voltage gradient along the axial length of coil 10 becomes highly non-linear. This non-linearity is primarily concentrated near the high voltage end and could trigger an arc between adjacent coils. Using the pancake stacking approach of FIG. 2 for making the coil 10, it becomes possible to control voltage gradient along the length of coil 10. This is accomplished by installing thicker insulation between pancakes near ends than those away from the ends.

In certain applications it may be desirable to increase the amount of superconductor in each pancake 12, thereby increasing its current-carrying capability. To do so, parallel, bifilar windings can be wound using several conductors "in hand". In other words, two or more conductors are wound together to form an individual pancake with multiple pairs of ends extending from the outermost 10 radial portion of the pancake.

Figure 6:
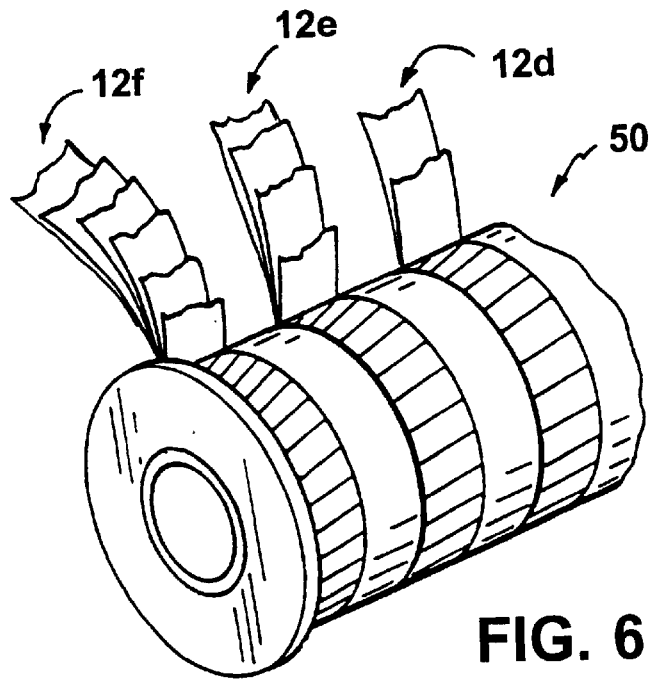
FIG. 6 is a view of an alternative embodiment of a coil showing the conductive windings partially peeled away.

Referring to FIG. 6, for example, a superconducting coil 50 includes a standard pancake 12d adjacent pancakes 12e, 12f wound two-in-hand and three-in-hand, respectively.

In the example shown in FIG. 6, assuming pancake 12d is capable of handling 50A, pancakes 12e and 12f would be capable of handling current levels of about 100A and 150A, respectively.

Figure 7:
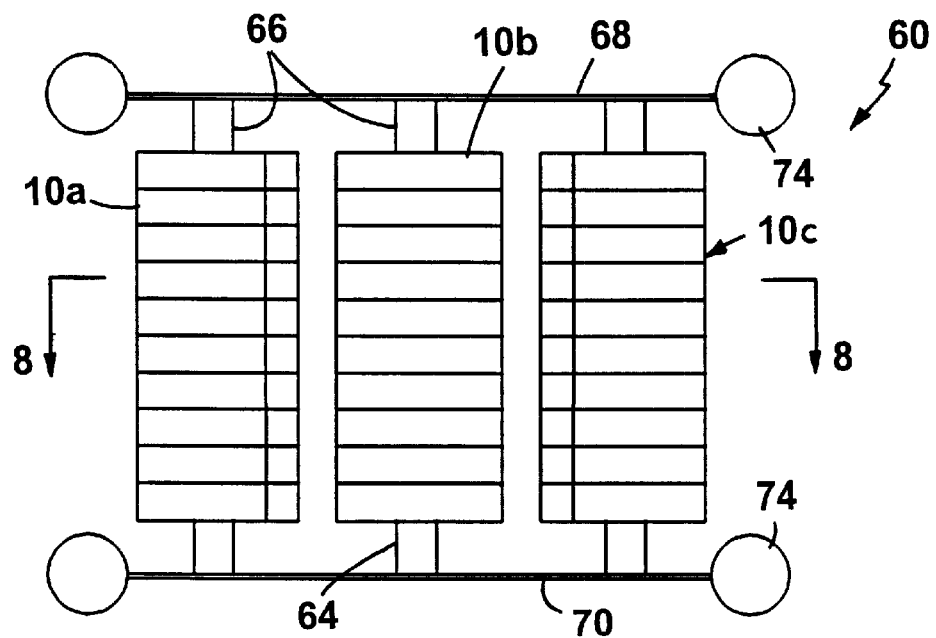
FIG. 7 is a side view of a fault current limiting coil assembly.
Figure 8:
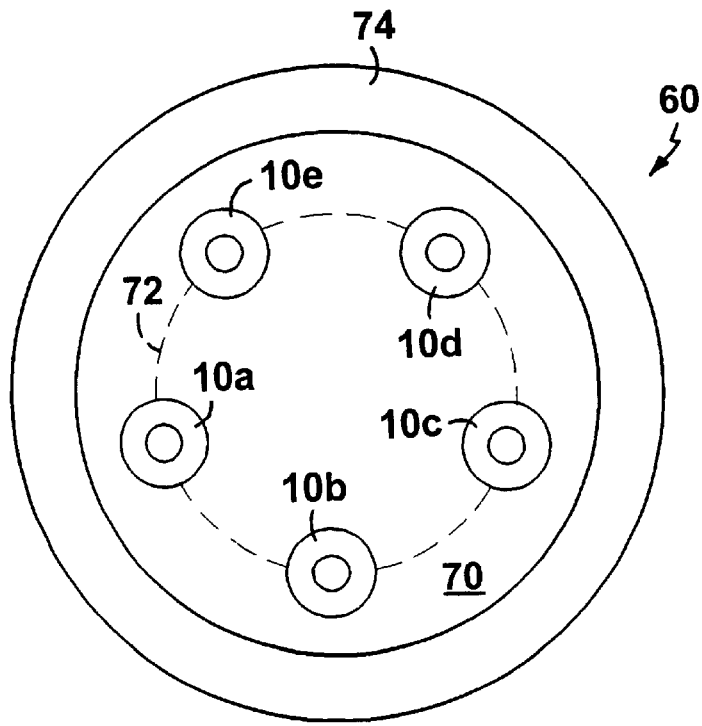
FIG. 8 is a top view of the fault current limiting coil assembly of FIG. 7.

Referring to FIGS. 7 and 8, a superconducting fault current detector 60 includes five superconducting coil assemblies 10a–10e (of the type described above in conjunction with FIGS. 2 and 3) supported on a coil support structure 64. Coil support structure 64 includes support posts 66 which extend between top and bottom end plates 68, 70 and are radially spaced, equally around the circumference of an imaginary circle 72 (shown dashed). Coil support structure 64 is formed of a suitable material (e.g., aluminum or stainless steel) and includes high voltage shields 74, where necessary, in the form of a round pipe, attached to end plates 68, 70.

As an example, each of coil assemblies 10a–10e includes ten bifilar-wound pancake coils 12 fabricated in the manner discussed above. Each coil assembly is capable of handling, in normal operation, 100 amperes of current, so that in aggregate, fault current limiter 60 is able to handle 500 amperes of current. A summary of the specifications and operating parameters for fault current detector 60 are summarized below in Table I.

TABLE I

| Parameter | Unit | Value |
| --- | --- | --- |
| Current Rating | A (rms) | 500 |
| Maximum resistance in limiting mode | Ω | 2 |
| Number of sub-coils | | 5 |
| Current per sub-coil | A | 100 |
| HTS conductor employed | inch | 0.164 * 0.008 |
| Matrix resistivity at 77 K | $\mu\Omega$-cm | 5 |
| Reference Je at 77 K, 0 T | A/cm$^2$ | 8,000 |
| Sub-coil parameters | | |
| Inside diameter | mm | 80 |
| Outside diameter | mm | 108 |
| Axial length | mm | 110 |
| Operating temperature | K | 68 |
| $B_{radial}$ | Gauss | 150 |
| $B_{axial}$ | Gauss | 150 |
| Je at working temp and fields | A/cm$^2$ | 8,227 |
| Number in-hand winding | | 2 |
| Number of pancakes | | 26 |
| Turns/pancakes | | 26 |
| Steady-state dissipation | W | 2 |
| AC loss | W | 25 |
| Hold-time | s | 0.10 |
| Peak temperature at end of hold-time | K | 220 |
| Wire required for each sub-coil | m | 600 |
| Wire required for whole limiter | m | 3,000 |
| Phase to ground voltage | kV | 6 |

In the event that there is a fault, and the current level through any of coil assemblies 10a–10e approaches, for example, 200 amperes, the superconducting material of the windings "quenches" causing the resistance of the coil to increase from a value of about 0 ohms to 10 ohms. In this non-superconducting state, fault current limiter 60 limits the flow of current in a range between 3 and 4 times the level of normal current for a period of approximately 100 msec.

Other embodiments are within the scope of the claims. For example, the superconductor used to wind bifilar pancake coils 12 may be formed of any number of different superconducting materials having a relatively high effective resistance per unit area, including both low and high temperature superconducting materials. Moreover, although the fault current limiting coils described above utilized superconducting tape 14, other forms of superconductor are equally applicable.

Figure 9A:
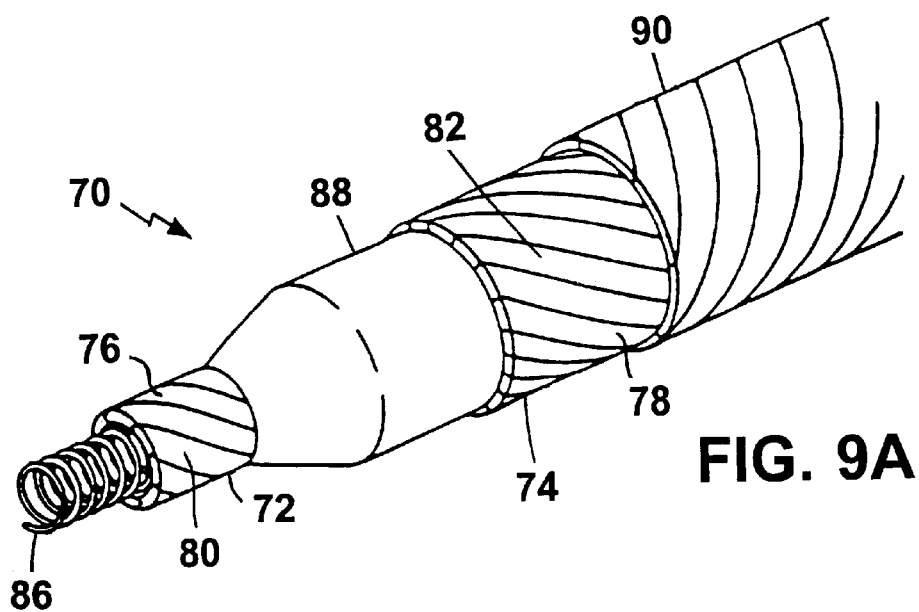
FIGS. 9A and 9B are isometric and cross-sectional views, respectively, of a round flexible superconducting coaxial cable used in an alternative embodiment of a fault current limiting assembly.
Figure 9B:
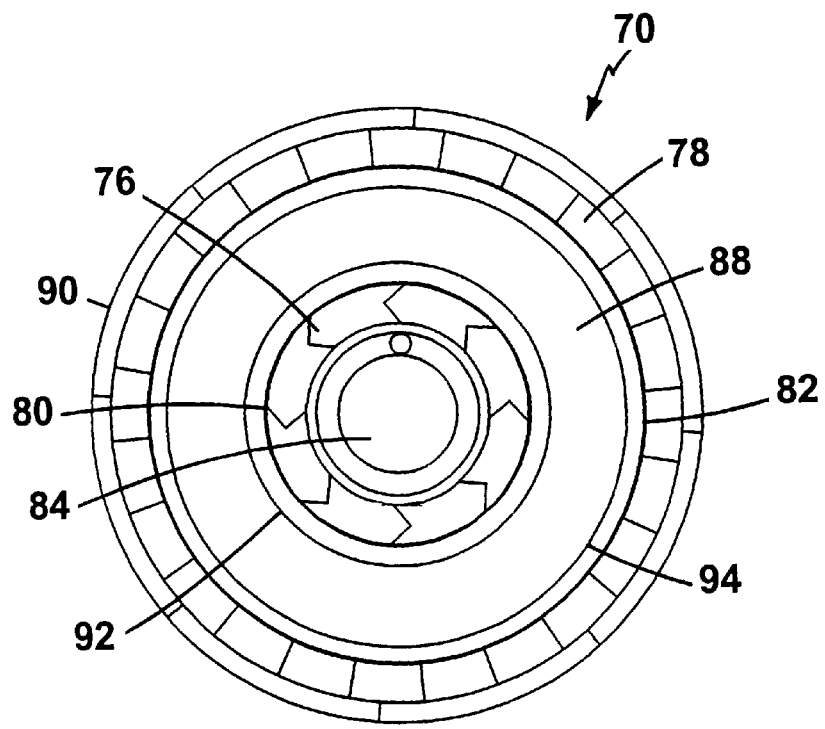

In particular, referring to FIGS. 9A and 9B, a flexible superconducting coaxial cable 70 well-suited for use in winding bifilar pancake coils 12 is shown. Cable 70 includes an inner tube 72 and an outer tube 74, both of which are formed of helically wound copper or aluminum segments 76, 78 and include superconductor layers 80, 82, respectively. Inner tube 72 has a channel 84 (FIG. 9B) through which liquid cryogen flows and within which a steel or aluminum support helix 86 (FIG. 9A) is positioned. Inner tube 72 is spaced from outer tube 74 by a dielectric layer 88. Outer tube 74 is surrounded by a helically wound protective sheath 90. Electrostatic shields 92, 94 are also positioned along inner and outer surfaces, respectively, of dielectric layer 88.

Carefully selecting the pitch angle of segments 76, 78, as well as the sheath 90, provides a well-balanced construction capable of handling significant torque. Winding bifilar pancakes 12 with a superconducting cable of this construction provides a significant advantage. In particular, helically winding the superconductor along the axis of the cable minimizes inductance along the axis of the cable. Further details relating to the construction and mechanical characteristics of similar flexible superconducting cables can be found in a report by the Brookhaven Power Transmission Group, entitled "Underground Power Transmission by Superconducting Cable", edited by E. B. Forsyth (National Technical Information Services, March 1972), and hereby incorporated by reference.

It should be appreciated that fault current limiter is not solely limited for use in bus network 100 in FIG. 1, but can be connected within a variety of power transmission and distribution networks including those described in the article entitled "Fault Current Limiters using Superconductors", by W. T. Norris and A. Powers, Cryogenics (see attached article), which is incorporated herein by reference.

Furthermore, although fault current limiter 10 can be described above as a stand-alone device, it can be incorporated within other components of the system including within the housing of a transformer or a motor.

What is claimed is:

1. A coil assembly having a longitudinal axis, the coil assembly comprising a plurality of bifilar pancake coils disposed in a stack arrangement along the longitudinal axis, each coil including a first pair of conductive winding sections joined along an innermost radial region of the coil, wound together, one over the other, radially outward and around the longitudinal axis, each pancake coil electrically connected to an adjacent pancake coil so that current flowing in adjacent turns of adjacent pancake coils flows in opposite directions at all radial regions of the coil assembly.

2. The coil assembly of claim 1 wherein the first pair of conductive winding sections are formed from an integral piece of conductive material.

3. The coil assembly of claim 1 wherein adjacent bifilar pancake coils are electrically connected in series.

4. The coil assembly of claim 1 further comprising a second pair of conductive winding sections joined along an innermost radial region of the coil, wound together, one over the other, radially outward and around the longitudinal axis, each winding section having an end at an outermost radial region of the coil, the second pair of conductive winding sections wound over and connected in parallel to the first pair of conductive winding sections.

5. The coil assembly of claim 4 wherein the first pair of conductive winding sections are in the form of a round coaxial cable.

6. The coil assembly of claim 1 wherein the first pair of conductive winding sections are formed of a superconducting material.

7. The coil assembly of claim 6 wherein the superconducting material is an anisotropic high temperature superconducting material.

8. The coil assembly of claim 7 wherein the anisotropic superconducting material is a multi-filament composite conductor including multiple superconducting filaments enclosed in matrix-forming material.

9. The coil assembly of claim 6 wherein the superconducting material is a monolithic superconductor material.

10. The coil assembly of claim 6 wherein the first pair of conductive winding sections are in the form of a superconducting tape.

11. The coil assembly of claim 1 wherein the first pair of conductive windings is wound such that current flows in opposite directions in overlying turns of the bifilar pancake coil.

12. A fault current limiter assembly comprising:
   a support structure having a central axis and a plurality of support members, each having a longitudinal axis radially spaced a predetermined distance from the central axis; and
   a plurality of coil assemblies, each disposed along a corresponding one of the longitudinal axis of the support members, each including:
   a plurality of bifilar pancake coils disposed in a stack arrangement along the longitudinal axis, each coil including a first pair of conductive winding sections joined along an innermost radial region of the coil, wound together, one over the other, radially outward and around the longitudinal axis, each pancake coil electrically connected to an adjacent pancake coil so that current flowing in adjacent turns of adjacent pancake coils flows in opposite directions at an outermost radial region of the coil assembly.

13. The fault current limiter assembly of claim 12 wherein adjacent bifilar pancake coils are electrically connected in series.

14. The fault current limiter assembly of claim 12 wherein each coil further includes a second pair of conductive winding sections joined along an innermost radial region of the coil, wound together, one over the other, and extending radially outward, each winding section having an end at an outermost radial region of the coil, the second conductive winding sections wound over and connected in parallel to the first conductive winding sections.

15. The fault current limiter assembly of claim 12 further comprising a high voltage shield positioned at ends of the coil support structure.

16. The fault current limiter assembly of claim 12 wherein the first pair of conductive winding sections of each magnetic coil are formed of a superconducting material.

17. The fault current limiter assembly of claim 16 wherein the superconducting material is an anisotropic high temperature superconducting material.

18. The fault current limiter assembly of claim 17 wherein the high temperature superconducting material is a multi-filament composite conductor including multiple superconducting filaments enclosed in matrix-forming material.

19. The fault current limiter assembly of claim 16 wherein the superconducting material is a monolithic superconductor material.

20. The fault current limiter assembly of claim 16 wherein the first pair of conductive winding sections are in the form of a superconducting tape.

21. The fault current limiter assembly of claim 16 wherein the first pair of conductive winding sections are in the form of a round coaxial cable.

22. The fault current limiter assembly of claim 12 wherein the first pair of conductive windings is wound such that current flows in opposite directions in overlying turns of the bifilar pancake coil.

23. A method of providing a fault current limiting coil having a longitudinal axis, the method comprising:

positioning a plurality of bifilar pancake coils in a stack arrangement along the longitudinal axis of the fault current limiting coil, each pancake coil including a first pair of conductive winding sections joined along an innermost radial region of the coil, wound together, one over the other, radially outward and around the longitudinal axis; and electrically connecting adjacent pancake coils so that current flowing in adjacent turns of adjacent pancake coils flows in opposite directions.

24. The method of claim 23 wherein electrically connecting adjacent bifilar pancake coils includes connecting the adjacent pancake coils in a series.

25. The method of claim 23 further comprising providing the first pair of conductive winding section from an integral piece of conductive material.

26. The method of claim 23 wherein at least one of the bifilar pancake coils includes a second pair of bifilar conductive windings wound over each other and in parallel.

27. The method of claim 23 wherein the bifilar pancake coils are formed of a superconducting material.

28. The method of claim 27 wherein the superconducting material is an anisotropic high temperature superconducting material in the form of a superconducting tape.

29. The method of claim 28 wherein the anisotropic superconducting material is a multi-filament composite conductor including multiple superconducting filaments enclosed in matrix-forming material.

30. The method of claim 27 wherein the superconducting material is a monolithic superconductor material.

31. The method of claim 23 wherein each bifilar pancake coil is wound such that current flows in opposite directions in overlying turns of the bifilar pancake coil.

* * * * *